United States Patent
Seo et al.

(10) Patent No.: US 6,819,602 B2
(45) Date of Patent: Nov. 16, 2004

(54) MULTIMODE DATA BUFFER AND METHOD FOR CONTROLLING PROPAGATION DELAY TIME

(75) Inventors: Seong-young Seo, Suwon (KR); Jung-bae Lee, Yongin (KR); Byong-mo Moon, Seoul (KR)

(73) Assignee: Samsung Electronics Co., Ltd., Kyungki-Do (KR)

(*) Notice: Subject to any disclaimer, the term of this patent is extended or adjusted under 35 U.S.C. 154(b) by 77 days.

(21) Appl. No.: 10/278,071

(22) Filed: Oct. 23, 2002

(65) Prior Publication Data

US 2003/0210575 A1 Nov. 13, 2003

Related U.S. Application Data

(60) Provisional application No. 60/379,665, filed on May 10, 2002.

(51) Int. Cl.[7] .................................................. G11C 7/00
(52) U.S. Cl. .................. 365/193; 365/189.05; 365/191; 365/194
(58) Field of Search ............................ 365/189.05, 191, 365/193, 194

(56) References Cited

U.S. PATENT DOCUMENTS

| 6,279,073 | B1 | * | 8/2001 | McCracken et al. | ........ 711/105 |
|---|---|---|---|---|---|
| 6,396,768 | B2 | * | 5/2002 | Ooishi | .................. 365/233 |
| 6,414,517 | B1 | | 7/2002 | Kim et al. | |
| 6,424,590 | B1 | * | 7/2002 | Taruishi et al. | ......... 365/230.08 |
| 6,452,849 | B1 | * | 9/2002 | Iwamoto | ................. 365/201 |
| 6,512,704 | B1 | * | 1/2003 | Wu et al. | ............... 365/189.07 |
| 2003/0090294 | A1 | * | 5/2003 | Chang | .................. 326/93 |

FOREIGN PATENT DOCUMENTS

| EP | 0322915 A3 | 7/1989 |
|---|---|---|
| KR | 2002046826 | 6/2002 |

* cited by examiner

*Primary Examiner*—Van Thu Nguyen
(74) *Attorney, Agent, or Firm*—Harness, Dickey & Pierce, P.L.C.

(57) ABSTRACT

A data buffer, such as a data strobe input buffer or a data input buffer, which may operate in multiple modes, such as a single mode (SM) and a dual mode (DM) and where the mode is selected by providing a signal, such as an external signal such as an address signal or an external command signal. A data buffer which can be used for a SM/DM dual-use and can improve a data setup/hold margin. A semiconductor memory device including one or more of the data buffers described above. A method for controlling propagation delay times which can improve a data setup/hold margin in a SM/DM dual-use data buffer.

29 Claims, 13 Drawing Sheets

MULTIMODE DATA BUFFER AND METHOD FOR CONTROLLING PROPAGATION DELAY TIME

CROSS REFERENCE TO RELATED APPLICATIONS

This U.S. nonprovisional application claims priority under 35 U.S.C. § 119 to U.S. Provisional Patent Application No. 60/379,665 filed May 10, 2002, the entire contents of which are incorporated by reference.

BACKGROUND OF THE INVENTION

1. Field of the Invention

The present invention relates to a semiconductor memory device, and more particularly, to a multimode data buffer and a method for controlling propagation time delay.

2. Description of the Related Art

To improve system performances, innovations in the design of semiconductor memory devices in general, and the design of dynamic random access memories (DRAMs) in particular, continue to focus on higher integration and higher speed operation. That is, DRAMs capable of processing more data at higher speed are desired. For higher speed operations, DRAMs synchronized with a system clock have been developed. This synchronous feature of DRAMs has increased data transmission speeds.

However, since a data input/output operation in a synchronous DRAM should be performed in a cycle of a system clock, there is a limit to increasing the bandwidth between the synchronous DRAM and a DRAM controller, that is, the amount of data which is input/output from a memory device in a unit time is limited. In order to increase data transmission speed, dual data rate (DDR) synchronous DRAMs in which data is input/output synchronized both with the rising edge and falling edge of a clock have been developed.

In general, a DDR synchronous DRAM uses a data strobe signal when the DRAM receives data from a memory controller or sends data to the memory controller. For example, in a data receiving operation, the DDR synchronous DRAM receives data with a data strobe signal from the memory controller. Also, in a data outputting operation, the DDR synchronous DRAM outputs data with a data strobe signal to the memory controller.

In high speed semiconductor memory devices such as DDR synchronous DRAMs, a single mode (SM)-type input buffer, which compares a data strobe signal with a reference voltage, is used as a data strobe input buffer. However, in a DDR synchronous DRAM having an SM-type data strobe signal input buffer, a data setup/hold time margin may be degraded if noise is included in a data strobe signal or reference voltage.

In order to compensate for this problem, a dual mode (DM)-type data strobe signal input buffer which compares a data strobe signal with the inverse signal of the data strobe signal instead of reference voltage has been introduced.

Since an output signal is determined at the cross point of the two signals, that is, the data strobe signal and an inverse of the data strobe signal, in the DM-type data strobe signal input buffer, noise immunity improves.

Also, more recently, in order to satisfy demands of a variety of users, an SM/DM dual-use data strobe signal input buffer has been developed. In an SM/DM dual-use data strobe signal input buffer, propagation delay time from an input terminal to an output terminal should be substantially the same both in the single mode (SM) and in the dual mode (DM). However, since the gain of a differential amplifier in the single mode is different from the gain in the dual mode, the propagation delay time in the single mode is different from the propagation delay time in the dual mode.

FIG. 1 illustrates waveforms produced in accordance with the prior art. As shown in FIG. 1, propagation delay time of the differential output signal (DS) in the SM mode is much greater than in the DM mode. Outputting the differential output signal (DS) at a different time in the SM mode and the DM mode degrades the uniformity of both the data setup time (tDS) and the data hold time (tDH) as illustrated in FIG. 1. The difference in the propagation delay time may cause a difference in the setup/hold timing in each mode such that a data setup/hold margin is degraded.

SUMMARY OF THE INVENTION

Exemplary embodiments of the present invention are directed to a data buffer, which operates in a multiple modes, such as a data strobe input buffer or a data input buffer, each of which may operate a single mode (SM) and a dual mode (DM) and where a mode is selected by providing a signal, such as an external signal such as an address signal or an external command signal. The signal may be supplied by a number of sources, such as an internal mode register set (MRS), a fuse circuit, or a bonding pad circuit.

Exemplary embodiments of the present invention are also directed to a data buffer which can be used for a SM/DM dual-use and can improve a data setup/hold margin.

Exemplary embodiments of the present invention are also directed to a semiconductor memory device including one or more of the data buffers described above.

In addition, exemplary embodiments of the present invention are directed to a method for controlling propagation delay time which can improve a data setup/hold margin in a SM/DM dual-use data buffer.

Exemplary embodiments of the present invention are also directed to a data buffer including a differential amplifier circuit including at least two switches for passing an inverse data signal or a reference voltage, respectively, depending on a level of a control signal, and a differential amplifier for receiving a data signal, and either the inverse data signal or the reference voltage and outputting at least two different differentially amplified signals.

In exemplary embodiments of the present invention, the data buffer is a data strobe input buffer, the inverse data signal is an inverse data strobe signal, and the data signal is a data strobe signal.

In exemplary embodiments of the present invention, the data strobe input buffer is operable in both a single mode and a dual mode, wherein in said single mode, the reference voltage is applied to a first of the at least two switches and the level of the control signal is a first logic state and in said dual mode, the inverse data strobe signal is provided to a second of the at least two switches 212 and the level of the control signal is a second logic state.

In exemplary embodiments of the present invention, the data strobe input buffer is part of a semiconductor memory device. In exemplary embodiments of the present invention, the semiconductor memory device also includes a control circuit for outputting the control signal to the data strobe input buffer.

In exemplary embodiments of the present invention, the control circuit includes a mode register set for receiving an external command and an address and generating the control signal, wherein a level of the control signal determines a mode of the semiconductor memory device.

In exemplary embodiments of the present invention, the control circuit includes a fuse circuit including a fuse, wherein a state of the fuse determines a level of the control signal.

In exemplary embodiments of the present invention, the control circuit includes a bonding pad circuit, wherein a connection to Vcc or ground determines a level of the control signal.

In exemplary embodiments of the present invention, the differential amplifier unit includes a single differential amplifier.

In exemplary embodiments of the present invention, the semiconductor memory device further includes a compensating circuit for compensating one of the inverse data strobe signal, the reference voltage, or the data strobe signal or one of the at least two different differentially amplified signals so that each of at least two differential output signals have substantially the same delay time.

In exemplary embodiments of the present invention, the compensating circuit includes a delay circuit for receiving the differentially amplified signal from said differential amplifier circuit, said delay circuit including a delay for delaying the differentially amplified signal, at least two additional switches for passing the differentially amplified signal or the delayed differentially amplified signal, as one of the at least two differential output signals, depending on the level of the control signal.

In exemplary embodiments of the present invention, the compensating circuit includes a dummy load applied to one of the inverse data strobe signal, the reference voltage, or the data strobe signal.

In exemplary embodiments of the present invention, the differential amplifier unit includes at least two differential amplifiers.

In exemplary embodiments of the present invention, a gain of a first of the at least two differential amplifiers is substantially different from a gain of a second of the at least two differential amplifiers so that each of at least two differential output signals have substantially the same delay time.

In exemplary embodiments of the present invention, a gain of a first of the at least two differential amplifiers is substantially the same as a gain of a second of the at least two differential amplifiers.

In exemplary embodiments of the present invention, the semiconductor memory device further includes a compensating circuit for compensating one of the inverse data strobe signal, the reference voltage, or the data strobe signal or one of the at least two different differentially amplified signals so that each of at least two differential output signals have substantially the same delay time.

In exemplary embodiments of the present invention, the compensating circuit includes a delay circuit for receiving the differentially amplified signal from said differential amplifier circuit, said delay circuit including a delay for delaying the differentially amplified signal, at least two additional switches for passing the differentially amplified signal or the delayed differentially amplified signal, as one of the at least two differential output signals, depending on the level of the control signal.

In exemplary embodiments of the present invention, the compensating circuit includes a dummy load applied to one of the inverse data strobe signal, the reference voltage, or the data strobe signal.

In exemplary embodiments of the present invention, the semiconductor memory device further includes data input buffer for receiving a data signal and a reference voltage and outputting a data input signal, a control circuit for outputting the control signal to the data strobe input buffer, and a data write circuit for receiving the data input signal from said data input buffer and the writing even number data of the data input signal into a first latch in response to a rising edge of the output data signal and writing odd number data of the data input signal into a second latch in response to a falling edge of the output data strobe signal.

In exemplary embodiments of the present invention, the first latch includes a plurality of latches and a plurality of switches, arranged alternatively. In exemplary embodiments of the present invention, the plurality of switches are arranged to be triggered on the leading and falling edge of an inverse of the differential output signal.

In exemplary embodiments of the present invention, a first switch receives the even number data of the output signal of the data input buffer and passes the even number data of the output signal to a first of the plurality of latches.

In exemplary embodiments of the present invention, the second latch including a plurality of latches and a plurality of switches, arranged alternatively.

In exemplary embodiments of the present invention, the plurality of switches are arranged to be triggered on the leading and falling edge of an inverse of the differential output signal.

In exemplary embodiments of the present invention, a first switch receives the odd number data of the output signal of the data input buffer and passes the odd number data of the output signal to a first of the plurality of latches.

In exemplary embodiments of the present invention, the data buffer is a data input buffer instead of, or in addition to, a data strobe buffer.

In exemplary embodiments of the present invention, the semiconductor memory device further includes a data strobe input buffer for receiving an inverse data signal or a reference voltage, respectively, depending on a level of a control signal, and outputting at least two differential output signals, a control circuit for outputting the control signal to said data strobe input buffer, and a data write circuit for receiving the data input signal from the data input buffer and the writing even number data of the data input signal into a first latch in response to a rising edge of the output data signal and writing odd number data of the data input signal into a second latch in response to a falling edge of the output data strobe signal.

Exemplary embodiments of the present invention are also directed to a method of controlling propagation delay time of a semiconductor memory, including receiving an inverse data signal or a reference voltage, respectively, depending on a level of a control signal, receiving a data signal and either the inverse data signal or the reference voltage, and amplifying and outputting at least two different differentially amplified signals.

In exemplary embodiments of the method of the present invention, the inverse data signal is an inverse data strobe signal and the data signal is a data strobe signal.

In exemplary embodiments of the method of the present invention, in a single mode, the reference voltage is received and a level of the control signal is a first logic state and in a dual mode, the inverse data strobe signal is received and the level of the control signal is a second logic state.

In exemplary embodiments of the method of the present invention, the control signal is received from an external source.

In exemplary embodiments of the method of the present invention, the method also includes receiving an external command and an address and generating the control signal, wherein a level of the control signal determines an operation mode of the semiconductor memory.

In exemplary embodiments of the method of the present invention, a state of a fuse determines a level of the control signal.

In exemplary embodiments of the method of the present invention, a connection to Vcc or ground via a bonding pad determines a level of the control signal.

In exemplary embodiments of the method of the present invention, the amplifying is performed by a single differential amplifier.

In exemplary embodiments of the method of the present invention, the method further comprises compensating one of the inverse data strobe signal, the reference voltage, or the data strobe signal or one of the at least two different differentially amplified signals so that each of at least two differential output signals have substantially the same delay time.

In exemplary embodiments of the method of the present invention, the compensating includes receiving the differentially amplified signal and delaying the differentially amplified signal, and outputting the differentially amplified signal or the delayed differentially amplified signal, as one of the at least two differential output signals, depending on the level of the control signal.

In exemplary embodiments of the method of the present invention, the compensating is performed with a dummy load applied to one of the inverse data strobe signal, the reference voltage, or the data strobe signal.

In exemplary embodiments of the method of the present invention, the amplifying is performed by at least two differential amplifiers.

In exemplary embodiments of the method of the present invention, a gain of a first of the at least two differential amplifiers is substantially different from a gain of a second of the at least two differential amplifiers so that each of at least two differential output signals have substantially the same delay time.

In exemplary embodiments of the method of the present invention, a gain of a first of the at least two differential amplifiers is substantially the same as a gain of a second of the at least two differential amplifiers.

In exemplary embodiments of the method of the present invention, the method further comprises compensating one of the inverse data strobe signal, the reference voltage, or the data strobe signal or one of the at least two different differentially amplified signals so that each of at least two differential output signals have substantially the same delay time.

In exemplary embodiments of the method of the present invention, the compensating includes receiving the differentially amplified signal, delaying the differentially amplified signal, and outputting the differentially amplified signal or the delayed differentially amplified signal, as one of the at least two differential output signals, depending on the level of the control signal.

In exemplary embodiments of the method of the present invention, the compensating is performed with a dummy load applied to one of the inverse data strobe signal, the reference voltage, or the data strobe signal.

In exemplary embodiments of the method of the present invention, the method further includes receiving a data signal and a reference voltage and outputting a data input signal, outputting the control signal, and receiving the data input signal and the writing even number data of the data input signal into a first latch in response to a rising edge of the output data signal and writing odd number data of the data input signal into a second latch in response to a falling edge of the output data strobe signal.

In exemplary embodiments of the method of the present invention, the first latch includes a plurality of latches and a plurality of switches, arranged alternatively.

In exemplary embodiments of the method of the present invention, the plurality of switches are arranged to be triggered on the leading and falling edge of an inverse of the differential output signal.

In exemplary embodiments of the method of the present invention, a first switch receives the even number data of the output signal and passes the even number data of the output signal to a first of the plurality of latches.

In exemplary embodiments of the method of the present invention, the second latch includes a plurality of latches and a plurality of switches, arranged alternatively.

In exemplary embodiments of the method of the present invention, the plurality of switches are arranged to be triggered on the leading and falling edge of an inverse of the differential output signal.

In exemplary embodiments of the method of the present invention, a first switch receives the odd number data of the output signal and passes the odd number data of the output signal to a first of the plurality of latches.

In exemplary embodiments of the method of the present invention, the data buffer is a data input buffer instead of, or in addition to, a data strobe buffer.

In exemplary embodiments of the method of the present invention, the method further includes receiving a data signal and a reference voltage and outputting a data input signal, outputting the control signal, and receiving the data input signal and the writing even number data of the data input signal into a first latch in response to a rising edge of the output data signal and writing odd number data of the data input signal into a second latch in response to a falling edge of the output data strobe signal.

BRIEF DESCRIPTION OF THE DRAWINGS

The present invention will become more apparent by describing in detail exemplary embodiments thereof with reference to the attached drawings in which.

DETAILED DESCRIPTION OF THE EXEMPLARY EMBODIMENTS OF THE PRESENT INVENTION

Figure 2:
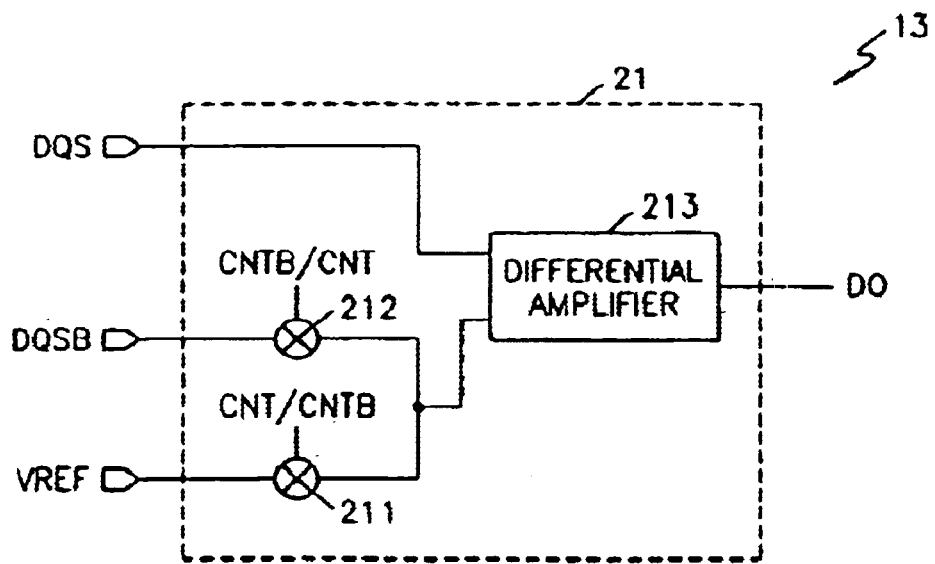
FIG. 2 is a block diagram of a data strobe input buffer according to an exemplary embodiment of the present invention.

FIG. 2 is a block diagram of a data strobe input buffer according to an exemplary embodiment of the present invention. The data strobe input buffer 13 is a multimode data strobe input buffer, for example, a single mode/dual mode (SM/DM) double-use data strobe input buffer. In response to a control signal (CNT/CNTB), the data strobe input buffer 13 differentially amplifies a data strobe signal (DQS) and a reference voltage (VREF), or the data strobe signal (DQS) and an inverse data strobe signal (DQSB).

More specifically, the data strobe input buffer 13 includes a differential amplification circuit 21. The differential amplification circuit 21 further includes one or more switches 211 and 212, and a differential amplifier 213. In an exemplary embodiment, the switches 211 and 212 are formed as transmission gates.

If the control signal (CNT) is at a first logic state, for example, in a "high" logic level, the switch 211 is turned on and the switch 212 is turned off. Accordingly, the differential amplifier 213 differentially amplifies the data strobe signal (DQS) and the reference voltage (VREF), and the differential amplified signal (DO) is output. This is operation in the single mode (SM).

If the control signal (CNT) is at a "low" logic level, for example, if the inverse control signal (CNTB) is at a "high" logic level, the switch 212 is turned on, and the switch 211 is turned off. Accordingly, the differential amplifier 213 differentially amplifies the data strobe signal (DQS) and the inverse data strobe signal (DQSB), and the differentially amplified signal (DO) is output. This is operation in the dual mode (DM).

Figure 3A:
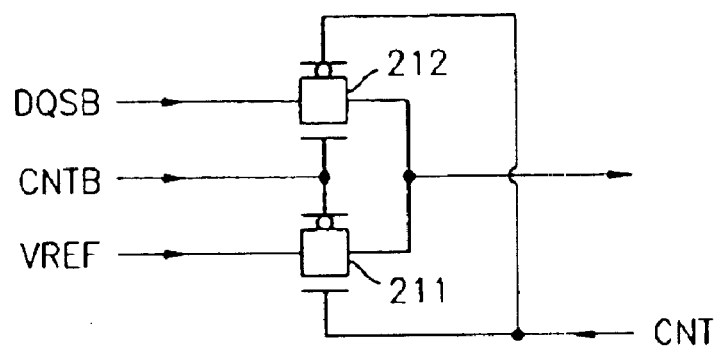
FIG. 3A is a block diagram of the switches according to an exemplary embodiment of the present invention.
Figure 3B:
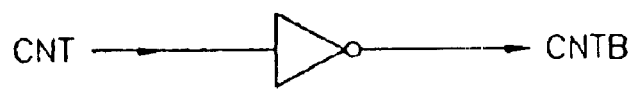
FIG. 3B is a block diagram which illustrates the conversion from the control signal (CNT) to the inverse control signal (CNTB) according to an exemplary embodiment of the present invention.

FIG. 3A is a block diagram of the switches 211 and 212 according to an exemplary embodiment of the present invention, where each switch 211, 212 is implemented as a transmission gate. As illustrated, each transmission gate receives the control signal (CNT) and the inverse control signal (CNTB) and either the inverse data strobe signal (DQSB) or the reference voltage (VREF). As also illustrated, according to an exemplary embodiment of the present invention, the transmission gates are triggered by the leading edge of a pulse of the control signal (CNT) and the inverse control signal (CNTB). FIG. 3B is a block diagram which illustrates the conversion from the control signal (CNT) to the inverse control signal (CNTB) performed by an inverter gate.

The data strobe input buffer 13 according to the exemplary embodiments of the present invention described above may be incorporated into a semiconductor memory device, such as an SDRAM. The data strobe input buffer may also be controlled by a control circuit, which provides the control signal (CNT) and the inverse control signal (CNTB).

Figure 4:
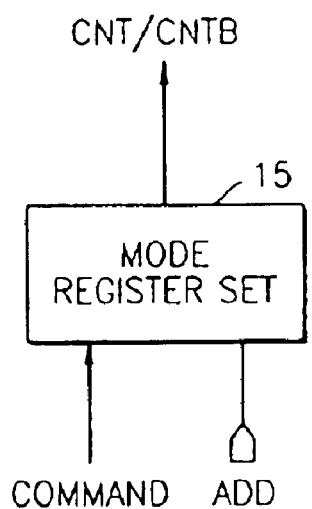
FIG. 4 is a block diagram of a control circuit according to an exemplary embodiment of the present invention.

FIG. 4 is a block diagram of a control circuit according to an exemplary embodiment of the present invention. As illustrated in FIG. 4, the control circuit is implemented as a mode register set 15. The mode register set 15 receives an external address signal (ADD) and/or a command signal and generates the control signal (CNT) and the inverse control signal (CNTB).

That is, in the semiconductor memory device according to exemplary embodiments of the present invention, one of several modes, for example, the SM and DM modes, of the data strobe input buffer 13 is easily selected externally through the mode register set 15.

Figure 5A:
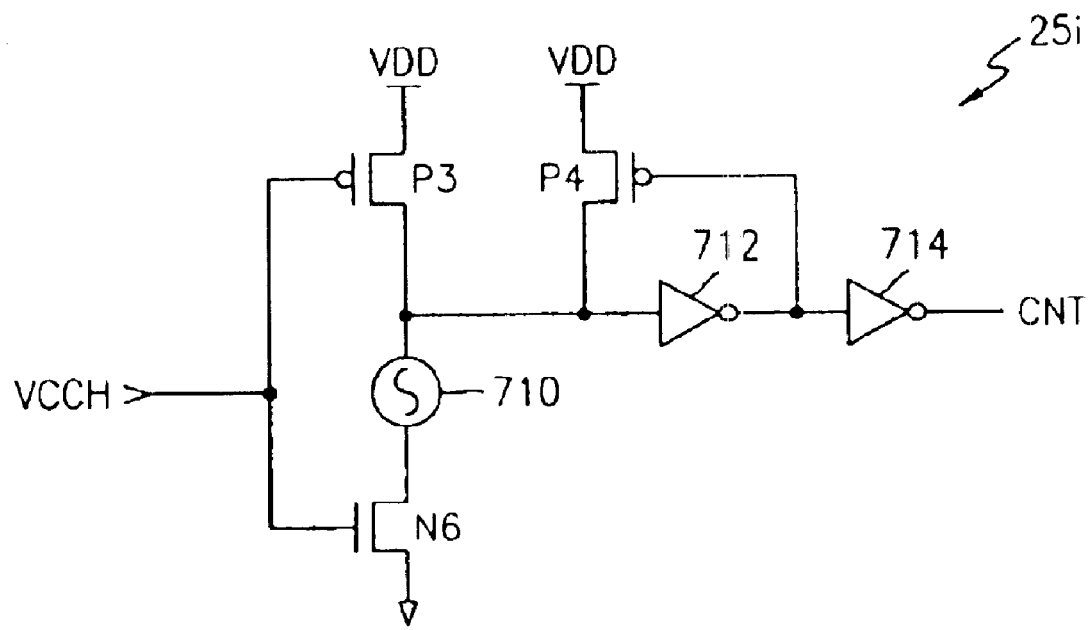
FIG. 5A is a block diagram of a control circuit according to another exemplary embodiment of the present invention.
Figure 5B:
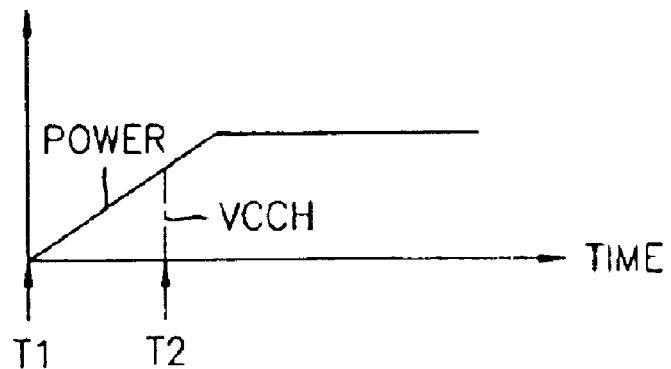
FIG. 5B illustrates a time versus voltage level plot relative to VCCH for the exemplary circuit of FIG. 5A.

FIG. 5A is a block diagram of another control circuit according to another exemplary embodiment of the present invention. As illustrated in FIG. 5A, the control circuit includes a fuse 710, as well as, two PMOS transistors P3, P4, one NMOS transistor N6, and two inverters 712, 714. FIG. 5B illustrates a time versus voltage level plot relative to VCCH for the circuit of FIG. 5A.

Figure 6:
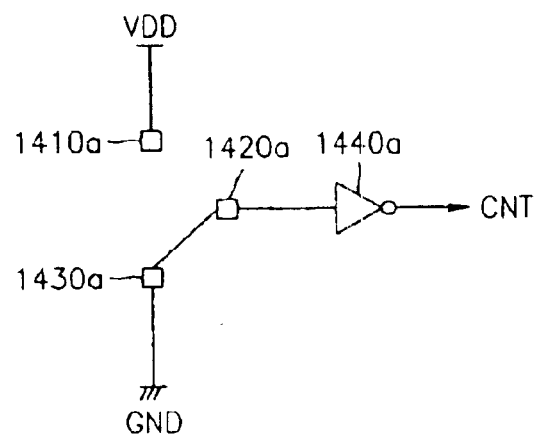
FIG. 6 is a block diagram of another control circuit according to another exemplary embodiment of the present invention.

FIG. 6 is a block diagram of another control circuit according to another exemplary embodiment of the present invention. As illustrated in FIG. 6, the control circuit includes a plurality of bonding pads 1410a, 1420a, and 1430a, and an inverter 1440a. A connection to the VCC or ground determines the level of the control signal (CNT) and the inverse control signal (CNTB).

Figure 7:
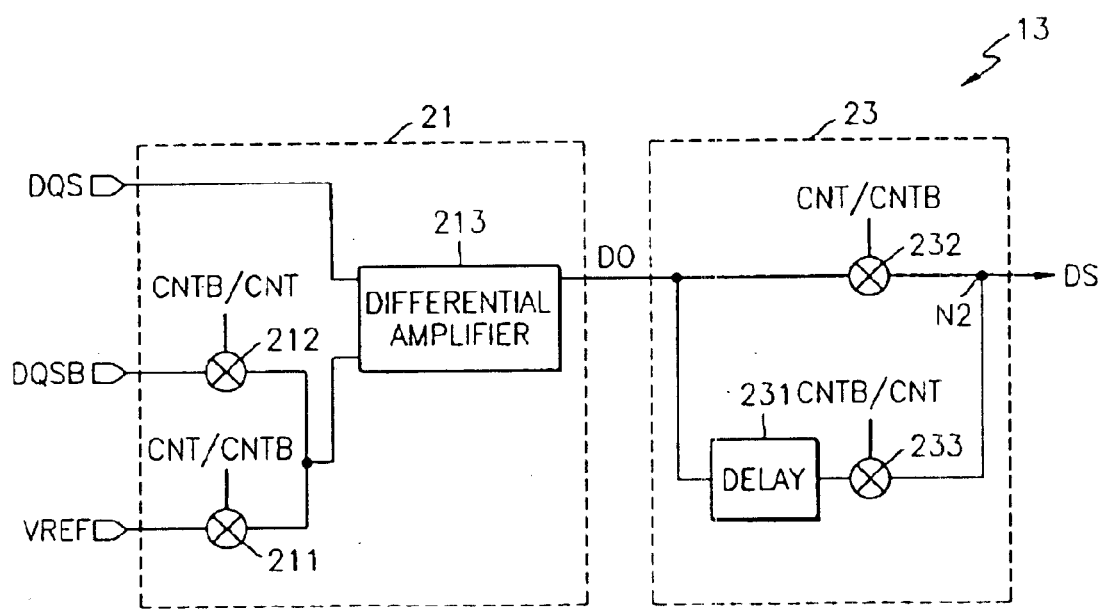
FIG. 7 is a block diagram of a data strobe input buffer according to another exemplary embodiment of the present invention.

FIG. 7 is a block diagram of a data strobe input buffer 13 according to another exemplary embodiment of the present invention. The data strobe input buffer 13 of FIG. 7 may include all of the elements of the exemplary embodiment of FIG. 2. The data strobe input buffer 13 of FIG. 7 may also include a compensating circuit 23 and a single differential amplifier 21. In the exemplary embodiment of FIG. 7, the compensating circuit 23 may comprise a delay 231, and one or more switches 232 and 233. In an exemplary embodiment, the switches 232 and 233 are formed as transmission gates.

If the control signal (CNT) is at a first logic state, for example, at a "high" logic level, the switches 211 and 232 are turned on and the switches 212 and 233 are turned off. Accordingly, the differential amplifier 213 differentially amplifies the data strobe signal (DQS) and the reference voltage (VREF), and the differential amplified signal (DO) is output as a differential output signal (DS) without delay (single mode operation). If the control signal (CNT) is at a "low" logic level, for example, if the inverse signal (CNTB) of the control signal is at a "high" logic level, the switches 212 and 233 are turned on, and the switches 211 and 232 are turned off. Accordingly, the differential amplifier 213 differentially amplifies the data strobe signal (DQS) and its inverse signal (DQSB), and the differentially amplified signal (DO) is delayed through the delay 231 for a desired time, and output as the output signal (DS) (dual mode operation).

The desired time is determined so that the propagation delay time of the data strobe input buffer 13 in the DM mode is substantially the same as the propagation delay in the SM mode. That is, the gain in the SM mode, in which the differential amplifier 213 differentially amplifies the data strobe signal (DQS) and the reference voltage (VREF), is less than the gain in the DM mode, in which the differential amplifier 213 differentially amplifies the data strobe signal (DQS) and its inverse signal (DQSB).

Accordingly, the propagation delay time of the data strobe input buffer 13 in the DM mode is shorter than that in the SM mode. Therefore, in the data strobe input buffer 13 according to other exemplary embodiments of the present invention, the differentially amplified signal is delayed through the delay 231 for a desired time in the DM mode such that the propagation delay time of the data strobe input buffer 13 in the DM mode is substantially the same as the propagation delay time in the SM mode. Accordingly, the setup/hold time in the SM mode is substantially the same as the setup/hold time in the DM mode, and as a result, the data setup/hold margin improves.

Figure 8:
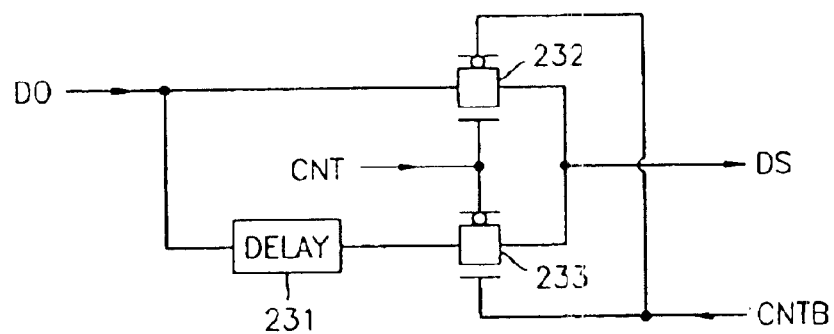
FIG. 8 is a block diagram of the switches according to an exemplary embodiment of the present invention.

FIG. 8 is a block diagram of the switches 232 and 233 according to an exemplary embodiment of the present invention, where each switch 232, 233 is implemented as a transmission gate. As illustrated, each transmission gate receives the differential amplified signal (DO), the control signal (CNT) and/or the inverse control signal (CNTB) and outputs the differential output signal (DS). As also illustrated, according to an exemplary embodiment of the present invention, the transmission gates are triggered by the leading edge of a pulse of the control signal (CNT) and the inverse control signal (CNTB).

Figure 1:
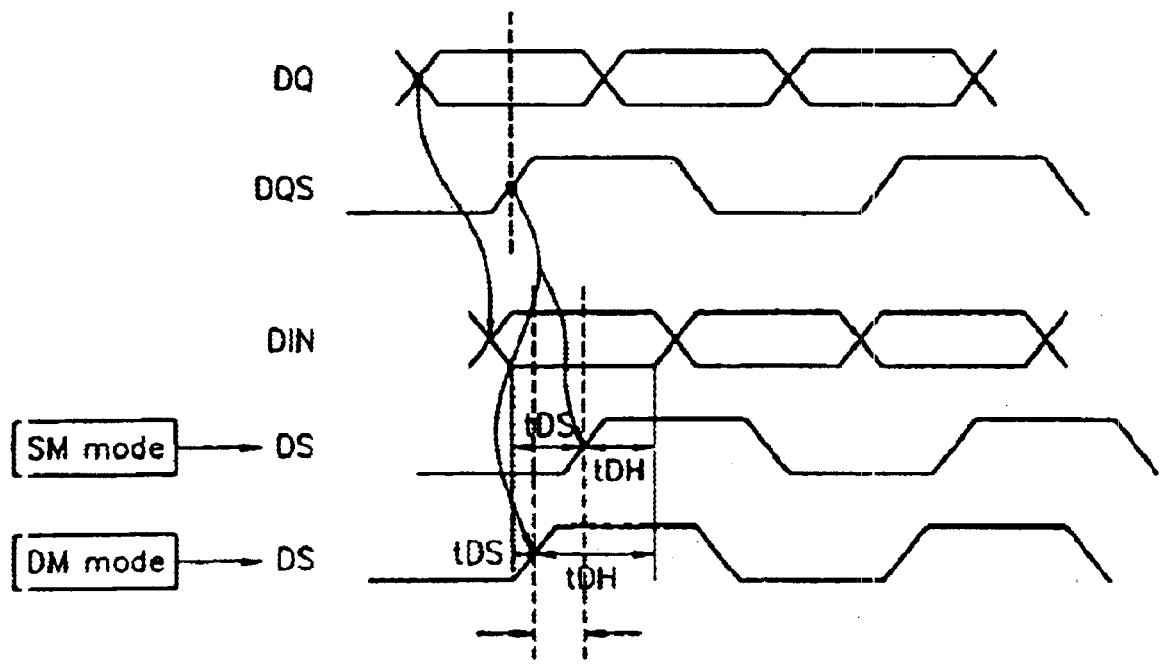
FIG. 1 illustrates waveforms produced in accordance with the prior art.
Figure 9:
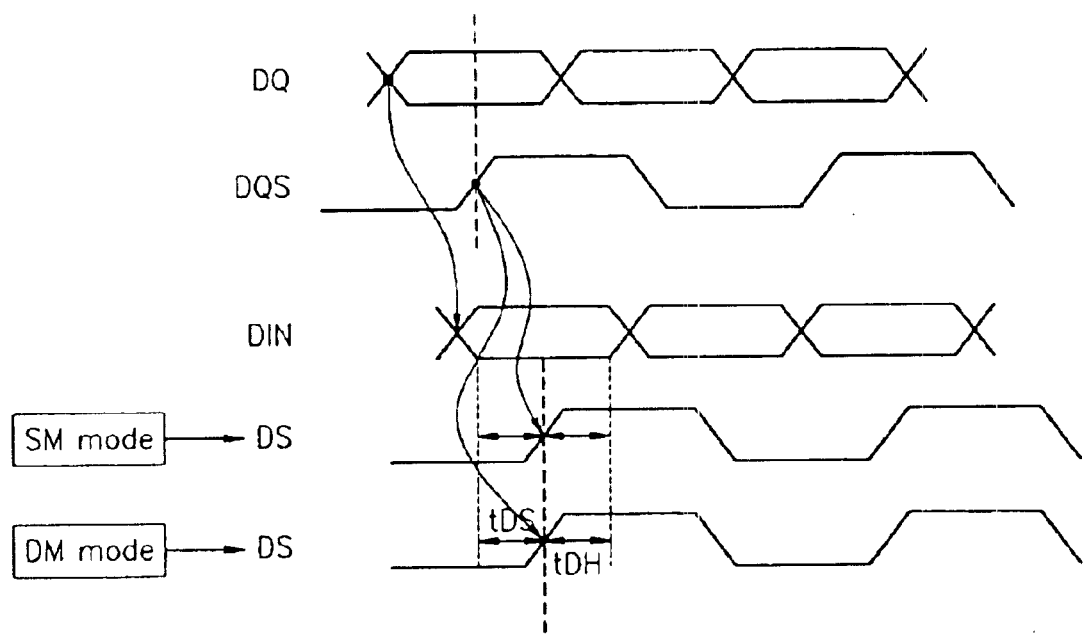
FIG. 9 illustrates waveforms produced in accordance with one or more exemplary embodiments of the present invention.

FIG. 9 illustrates waveforms produced in accordance with one or more exemplary embodiments of the present invention. As shown in FIG. 9, the differential output signal (DS) is output at the substantially the same time in the SM mode and the DM mode as a result of the delay 231. This is in contrast to the waveforms illustrated in FIG. 1, where the differential output signal (DS) in the DM mode is substantially ahead of the differential output signal (DS) in the SM mode. Outputting the differential output signal (DS) at the substantially the same time in the SM mode and the DM mode improves the uniformity of both the data setup time (tDS) and the data hold time (tDH) in comparison to FIG. 1.

Figure 10:
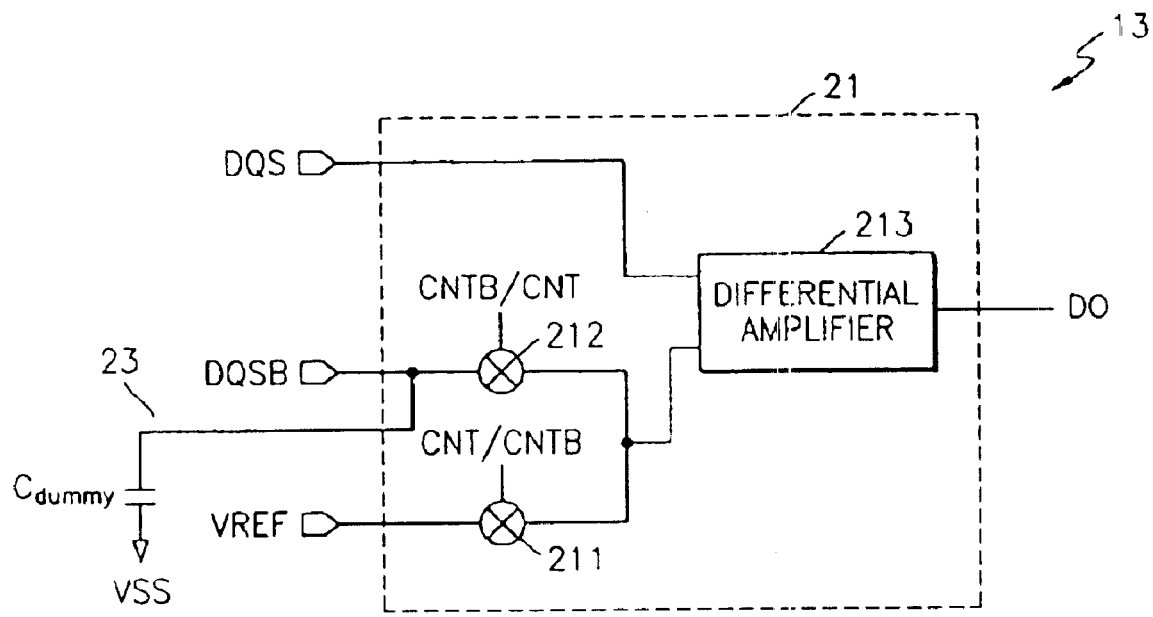
FIG. 10 is a block diagram of a data strobe input buffer according to another exemplary embodiment of the present invention.

FIG. 10 is a block diagram of a data strobe input buffer 13 according to another exemplary embodiment of the present invention. The data strobe input buffer 13 of FIG. 10 may include all of the elements of the exemplary embodiment of FIG. 2. The data strobe input buffer 13 of FIG. 10 may also include a compensating circuit 23 and a single differential amplification circuit 21. In the exemplary embodiment of FIG. 10, the compensating circuit 23 may comprise a dummy load capacitor Cdummy. In particularly, in a line through which the inverse signal (DQSB) is input, the dummy load capacitor Cdummy is added so as to have the same load as the load of a line in which the data strobe signal (DQS) is input.

Figure 11:
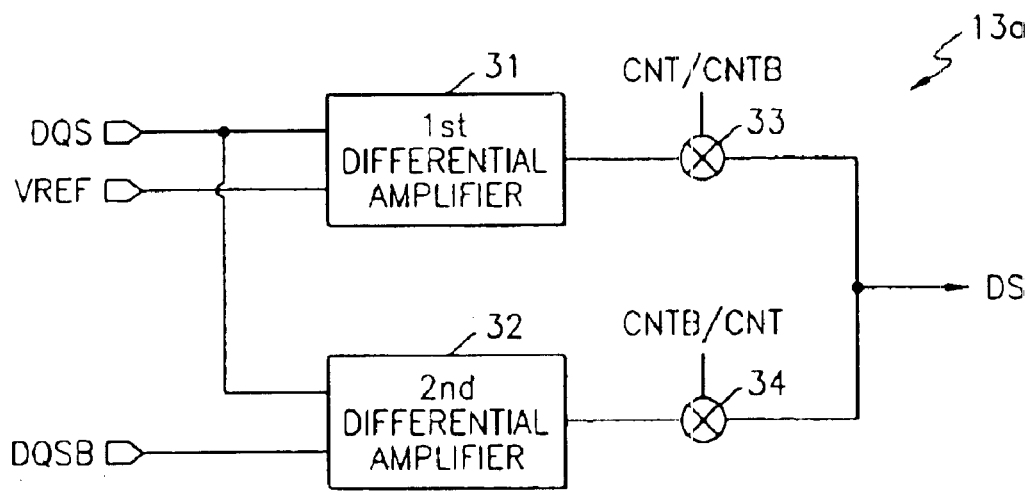
FIG. 11 is a block diagram of a data strobe input buffer according to another exemplary embodiment of the present invention.

FIG. 11 is a block diagram of a data strobe input buffer 13a according to another exemplary embodiment of the present invention. Referring to FIG. 11, the data strobe input buffer 13a according to another exemplary embodiment comprises a first differential amplifier 31, a second differential amplifier 32, and one or more switches 33 and 34. The switches 33 and 34 may be implemented as described above with respect to switches 211, 212, 232, and 233.

The first differential amplifier 31 differentially amplifies the data strobe signal (DQS) and the reference voltage (VREF). The second differential amplifier 32 differentially amplifies the data strobe signal (DQS) and the inverse data strobe signal (DQSB).

If the control signal (CNT) is at a first logic state, for example, at a "high" logic level, the switch 33 is turned on, and the switch 34 is turned off, and as a result, the output signal of the first differential amplifier 31 is output as the differential output signal (DS) (single mode). If the control signal (CNT) is at a "low" logic level, for example, if the inverse data strobe signal (CNTB) of the control signal is at a "high" logic level, the switch 33 is turned off, and the switch 34 is turned on. Accordingly, the output signal of the second differential amplifier 32 is output as the differential output signal (DS) (dual mode).

In this exemplary embodiment, if the effective gain of the first differential amplifier 31 is designed to be the substantially different from the effective gain of the second differential amplifier 32, so that the propagation delay time of the data strobe input buffer 13a in the DM mode can be substantially the same as the propagation delay time of the data strobe input buffer 13a in the SM mode. Outputting the differential output signal (DS) at the substantially the same time in the SM mode and the DM mode improves the uniformity of both the data setup time (tDS) and the data hold time (tDH).

Figure 12:
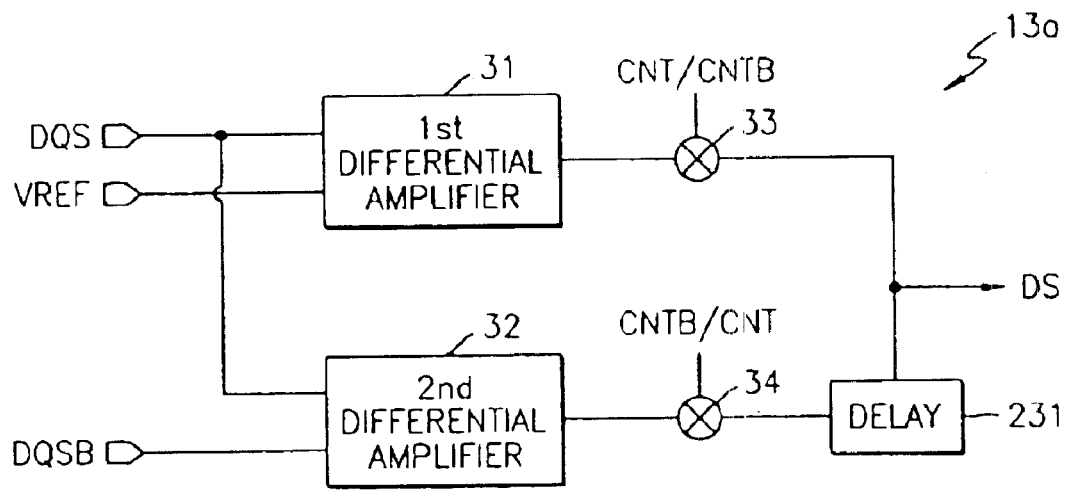
FIG. 12 is a block diagram of a data strobe input buffer according to another exemplary embodiment of the present invention.

FIG. 12 is a block diagram of a data strobe input buffer 13a according to another exemplary embodiment of the present invention. The data strobe input buffer 13a of FIG. 12 may include all of the elements of the exemplary embodiment of FIG. 11. The data strobe input buffer 13a of FIG. 12 may also include a delay 231, such as the one described in conjunction with FIG. 7. The second differential amplifier 32 differentially amplifies the data strobe signal (DQS) and its inverse signal (DQSB), and the differentially amplified signal is delayed through the delay 231 for a desired time, and output as the output signal (DS) (dual mode operation).

The desired time is determined so that the propagation delay time of the data strobe input buffer 13a in the DM mode is substantially the same as the propagation delay in the SM mode. That is, the gain in the SM mode, in which the first differential amplifier 31 differentially amplifies the data strobe signal (DQS) and the reference voltage (VREF), is less than the gain in the DM mode, in which the second differential amplifier 32 differentially amplifies the data strobe signal (DQS) and its inverse signal (DQSB).

Accordingly, the propagation delay time of the data strobe input buffer 13a in the DM mode is shorter than that in the SM mode. Therefore, in the data strobe input buffer 13a according to other exemplary embodiments of the present invention, the differentially amplified signal is delayed through the delay 231 for a desired time in the DM mode such that the propagation delay time of the data strobe input buffer 13a in the DM mode is substantially the same as the propagation delay time in the SM mode. Accordingly, the setup/hold time in the SM mode is substantially the same as the setup/hold time in the DM mode, and as a result, the data setup/hold margin improves.

Figure 13:
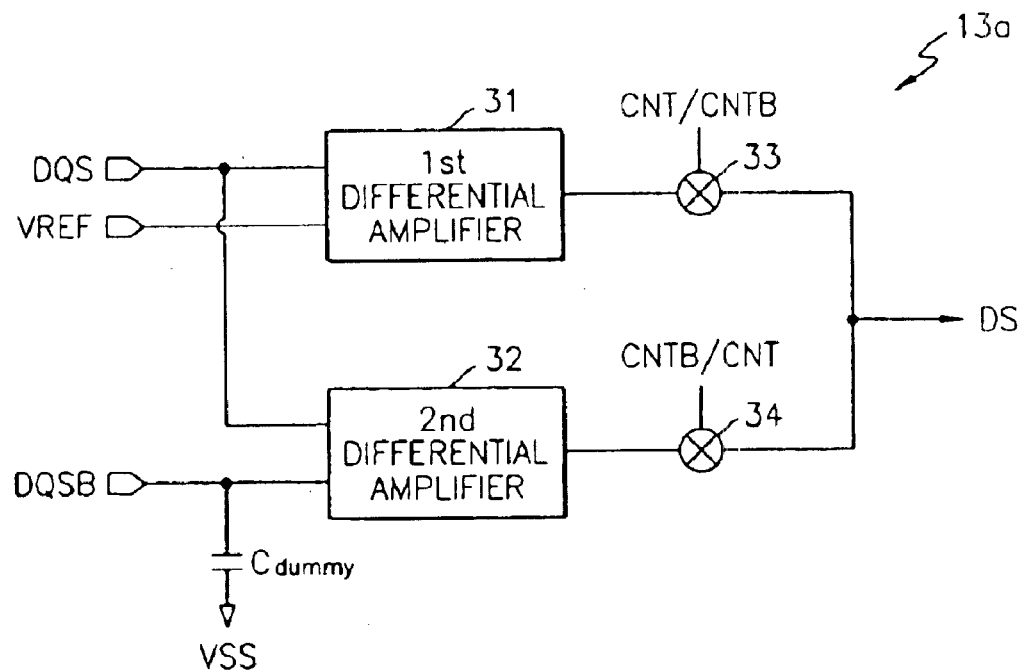
FIG. 13 is a block diagram of a data strobe input buffer according to another exemplary embodiment of the present invention.

FIG. 13 is a block diagram of a data strobe input buffer 13a according to another exemplary embodiment of the present invention. The data strobe input buffer 13a of FIG. 13 may include all of the elements of the exemplary embodiment of FIG. 11. The data strobe input buffer 13a of FIG. 13 may also include a dummy load capacitor Cdummy, such as the one described in conjunction with FIG. 10. In particular, in a line through which the inverse signal (DQSB) is input, the dummy load capacitor Cdummy is added so as to have the same load as the load of a line in which the data strobe signal (DQS) is input. The second differential amplifier 32 then differentially amplifies the data strobe signal (DQS) and its inverse signal (DQSB). Accordingly, the setup/hold time in the SM mode is substantially the same as the setup/hold time in the DM mode, and as a result, the data setup/hold margin improves.

A semiconductor memory device, such as an SDRAM, may include buffers other than a data strobe input buffer, for example, a data input buffer.

Figure 14:
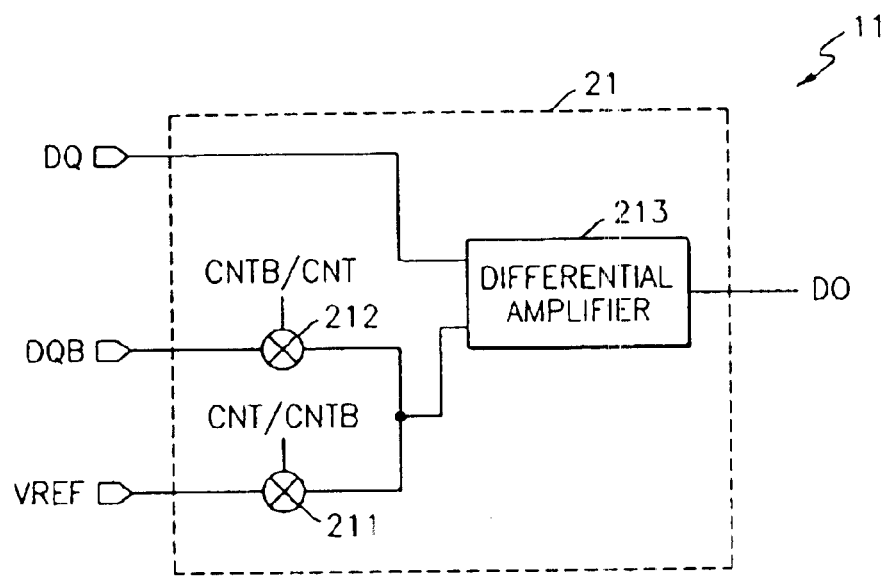
FIG. 14 is a block diagram of a data input buffer according to an exemplary embodiment of the present invention.

FIG. 14 is a block diagram of a data input buffer 11 according to an exemplary embodiment of the present invention. The data input buffer 11 is a multimode data input buffer, for example, a single mode/dual mode (SM/DM) double-use data input buffer. In response to a control signal (CNT/CNTB), the data input buffer 11 differentially amplifies a data signal (DQ) and a reference voltage (VREF), or the data signal (DQ) and an inverse data signal (DQB).

More specifically, the data input buffer 11 includes a differential amplification circuit 21. The differential amplification circuit 21 further includes one or more switches 211 and 212, and a differential amplifier 213. In an exemplary embodiment, the switches 211 and 212 are formed as transmission gates.

If the control signal (CNT) is at a first logic state, for example, at a "high" logic level, the switch 211 is turned on and the switch 212 is turned off. Accordingly, the differential amplifier 213 differentially amplifies the data signal (DQ) and the reference voltage (VREF), and the differential amplified signal (DO) is output. This is operation in the single mode (SM).

If the control signal (CNT) is at a "low" logic level, for example, if the inverse control signal (CNTB) is at a "high" logic level, the switch 212 is turned on, and the switch 211 is turned off. Accordingly, the differential amplifier 213 differentially amplifies the data signal (DQ) and the inverse data signal (DQB), and the differentially amplified signal (DO) is output. This is operation in the dual mode (DM).

The data input buffer 11 according to the exemplary embodiments of the present invention described above may be incorporated into a semiconductor memory device, such as an SDRAM. The data input buffer 11 may also be controlled by a control circuit, which provides the control signal (CNT) and the inverse control signal (CNTB).

Each of the control circuits described above in conjunction with the various exemplary embodiments of the data strobe input buffer 13, 13a, namely the exemplary control circuits of FIGS. 4, 5A, and 6 are also applicable to a data input buffer.

For example, the control circuit of the data input buffer could be implemented as the mode register set 15, as a fuse 710, two PMOS transistors P3, P4, one NMOS transistor N6, and two inverters 712, 714, or as a plurality of bonding pads 1410a, 1420a, and 1430a, and an inverter 1440a.

Figure 15:
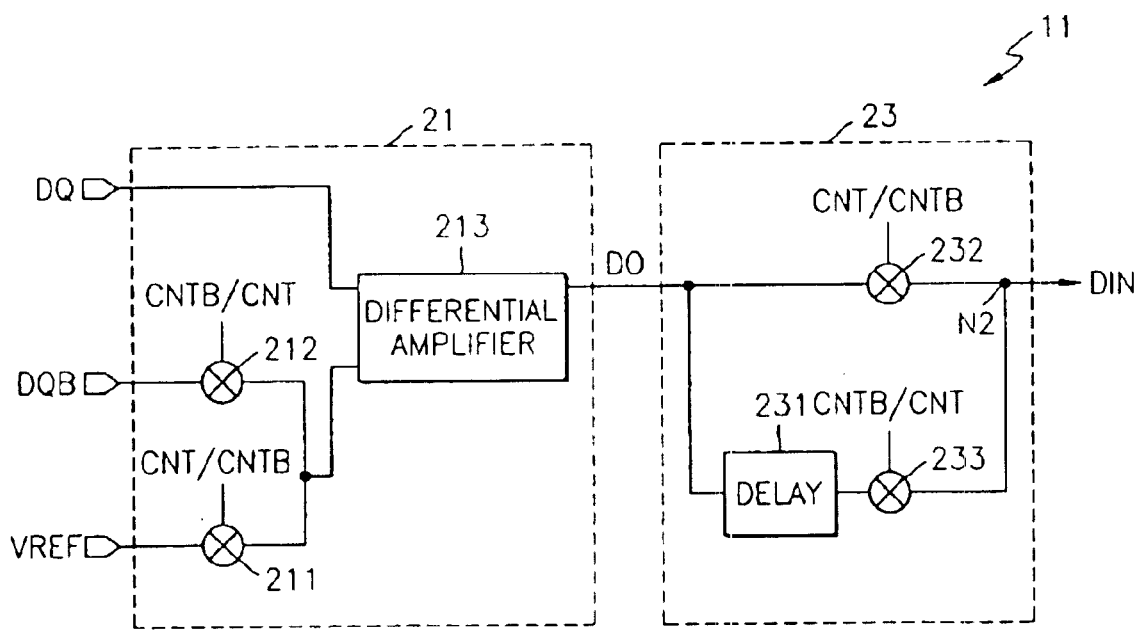
FIG. 15 is a block diagram of a data input buffer according to another exemplary embodiment of the present invention.

FIG. 15 is a block diagram of a data input buffer 11 according to another exemplary embodiment of the present invention. The data input buffer 11 of FIG. 15 may include all of the elements of the exemplary embodiment of FIG. 14. The data input buffer 11 of FIG. 15 may also include a compensating circuit 23 and a single differential amplifier 213. In the exemplary embodiment of FIG. 15, the compensating circuit 23 may comprise a delay 231, and one or more switches 232 and 233. In an exemplary embodiment, the switches 232 and 233 are formed as transmission gates.

If the control signal (CNT) is at a first logic state, for example, at a "high" logic level, the switches 211 and 232 are turned on and the switches 212 and 233 are turned off. Accordingly, the differential amplifier 213 differentially amplifies the data signal (DQ) and the reference voltage (VREF), and the differential amplified signal (DO) is output as a differential output signal (DIN) without delay (single mode operation). If the control signal (CNT) is at a "low" logic level, for example, if the inverse signal (CNTB) of the control signal is at a "high" logic level, the switches 212 and 233 are turned on, and the switches 211 and 232 are turned off. Accordingly, the differential amplifier 213 differentially amplifies the data signal (DQ) and its inverse signal (DQB), and the differentially amplified signal (DO) is delayed through the delay 231 for a desired time, and output as the output signal (DIN) (dual mode operation).

The desired time is determined so that the propagation delay time of the data input buffer 11 in the DM mode is substantially the same as the propagation delay in the SM mode. That is, the gain in the SM mode, in which the differential amplifier 213 differentially amplifies the data signal (DQ) and the reference voltage (VREF), is less than the gain in the DM mode, in which the differential amplifier 213 differentially amplifies the data signal (DQ) and its inverse signal (DQB).

Accordingly, the propagation delay time of the data input buffer 11 in the DM mode is shorter than that in the SM mode. Therefore, in the data input buffer 11 according to other exemplary embodiments of the present invention, the differentially amplified signal is delayed through the delay 231 for a desired time in the DM mode such that the propagation delay time of the data input buffer 11 in the DM mode is substantially the same as the propagation delay time in the SM mode. Accordingly, the setup/hold time in the SM mode is substantially the same as the setup/hold time in the DM mode, and as a result, the data setup/hold margin improves.

Figure 16:
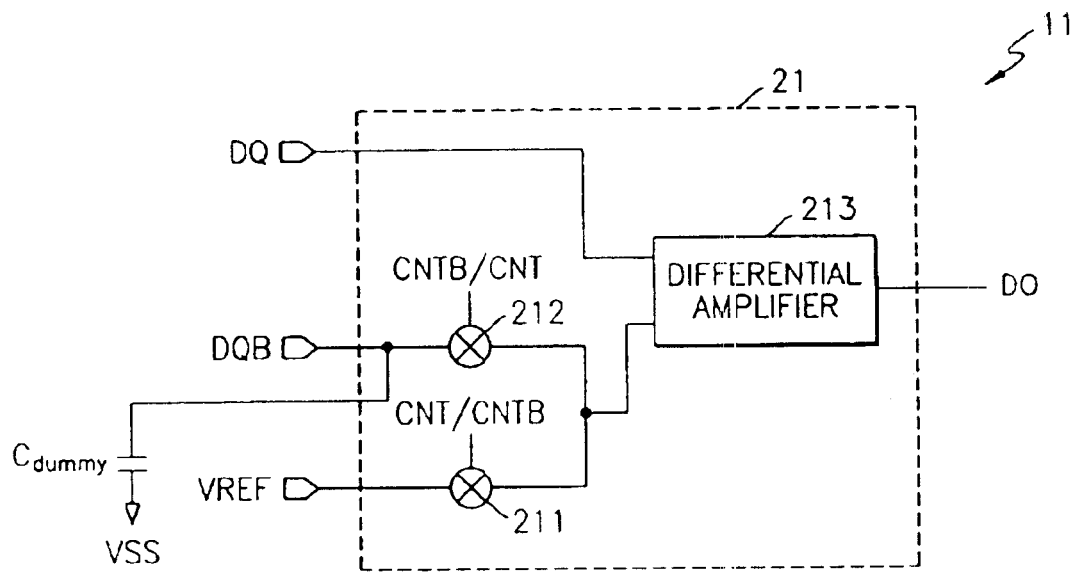
FIG. 16 is a block diagram of a data input buffer according to another exemplary embodiment of the present invention.

FIG. 16 is a block diagram of a data input buffer 11 according to another exemplary embodiment of the present invention. The data input buffer 11 of FIG. 16 may include all of the elements of the exemplary embodiment of FIG. 14. The data input buffer 11 of FIG. 16 may also include a compensating circuit 23 and a single differential amplifier 21. In the exemplary embodiment of FIG. 16, the compensating circuit 23 may comprise a dummy load capacitor Cdummy. In particular, in a line through which the inverse signal (DQB) is input, the dummy load capacitor Cdummy is added so as to have the same load as the load of a line in which the data signal (DQ) is input.

Figure 17:
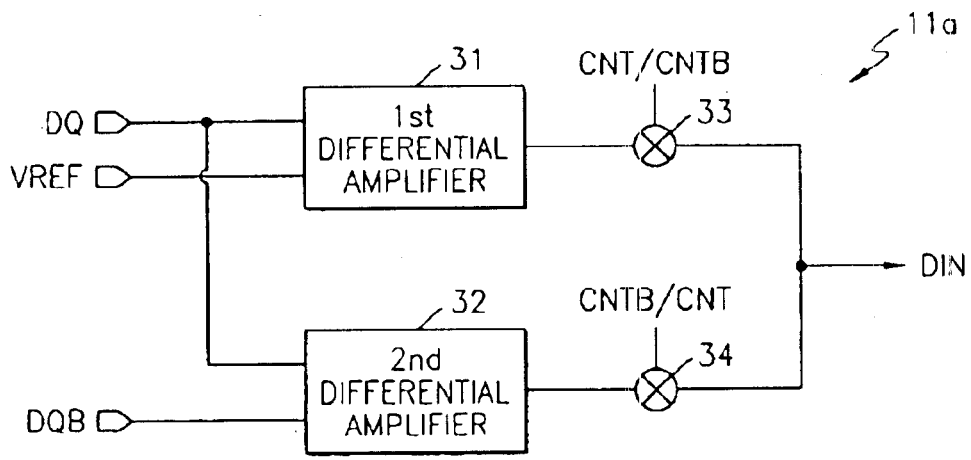
FIG. 17 is a block diagram of a data input buffer according to another exemplary embodiment of the present invention.

FIG. 17 is a block diagram of a data input buffer 11a according to another exemplary embodiment of the present invention. Referring to FIG. 17, the data input buffer 11a according to another exemplary embodiment comprises a first differential amplifier 31, a second differential amplifier 32, and one or more switches 33 and 34. The switches 33 and 34 may be implemented as described above with respect to switches 211, 212, 232, and 233.

The first differential amplifier 31 differentially amplifies the data signal (DQ) and the reference voltage (VREF). The second differential amplifier 32 differentially amplifies the data signal (DQ) and the inverse data signal (DQB).

If the control signal (CNT) is at a first logic state, for example, at a "high" logic level, the switch 33 is turned on, and the switch 34 is turned off, and as a result, the output signal of the first differential amplifier 31 is output as the differential output signal (DIN) (single mode). If the control signal (CNT) is at a "low" logic level, for example, if the inverse data signal (CNTB) of the control signal is at a "high" logic level, the switch 33 is turned off, and the switch 34 is turned on. Accordingly, the output signal of the second differential amplifier 32 is output as the differential output signal (DIN) (dual mode).

In this exemplary embodiment, if the effective gain of the first differential amplifier 31 is designed to be the substantially different from the effective gain of the second differential amplifier 32, the propagation delay time of the data input buffer 11a in the DM mode can be substantially the same as the propagation delay time of the data input buffer 11a in the SM mode. Outputting the differential output signal (DIN) at the substantially the same time in the SM mode and the DM mode improves the uniformity of both the data setup time (tDS) and the data hold time (tDH).

Figure 18:
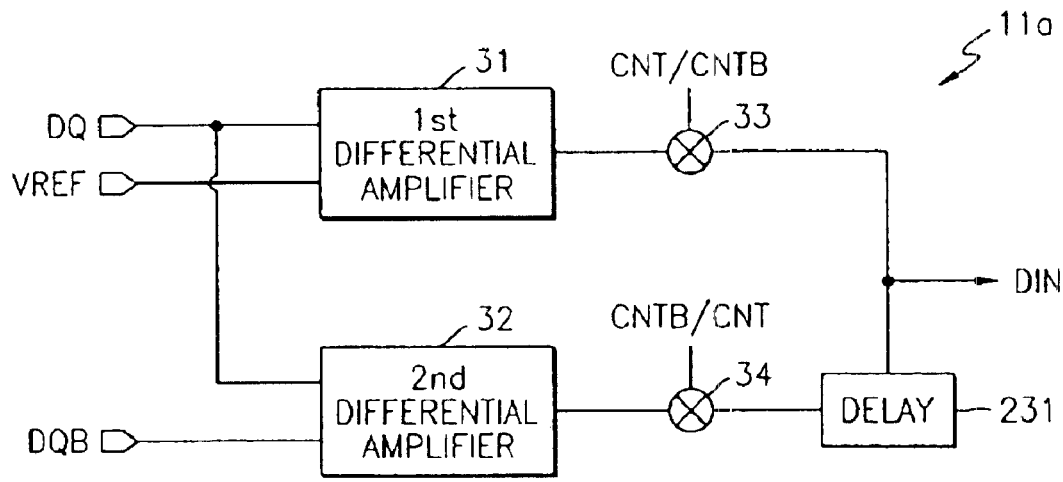
FIG. 18 is a block diagram of a data input buffer according to another exemplary embodiment of the present invention.

FIG. 18 is a block diagram of a data input buffer 11a according to another exemplary embodiment of the present invention. The data input buffer 11a of FIG. 18 may include all of the elements of the exemplary embodiment of FIG. 14. The data input buffer 11a of FIG. 18 may also include a delay 231, such as the one described in conjunction with FIG. 15. The second differential amplifier 32 differentially amplifies the data signal (DQ) and its inverse signal (DQB), and the differentially amplified signal is delayed through the delay 231 for a desired time, and output as the output signal (DIN) (dual mode operation).

The desired time is determined so that the propagation delay time of the data input buffer 11a in the DM mode is substantially the same the propagation delay in the SM mode. That is, the gain in the SM mode, in which the first differential amplifier 31 differentially amplifies the data signal (DQ) and the reference voltage (VREF), is less than the gain in the DM mode, in which the second differential amplifier 32 differentially amplifies the data signal (DQ) and its inverse signal (DQB).

Accordingly, the propagation delay time of the data input buffer 11a in the DM mode is shorter than that in the SM mode. Therefore, in the data input buffer 11a according to other exemplary embodiments of the present invention, the differentially amplified signal is delayed through the delay 231 for a desired time in the DM mode such that the propagation delay time of the data input buffer 11a in the DM mode is substantially the same as the propagation delay time in the SM mode. Accordingly, the setup/hold time in the SM mode is substantially the same as the setup/hold time in the DM mode, and as a result, the data setup/hold margin improves.

Figure 19:
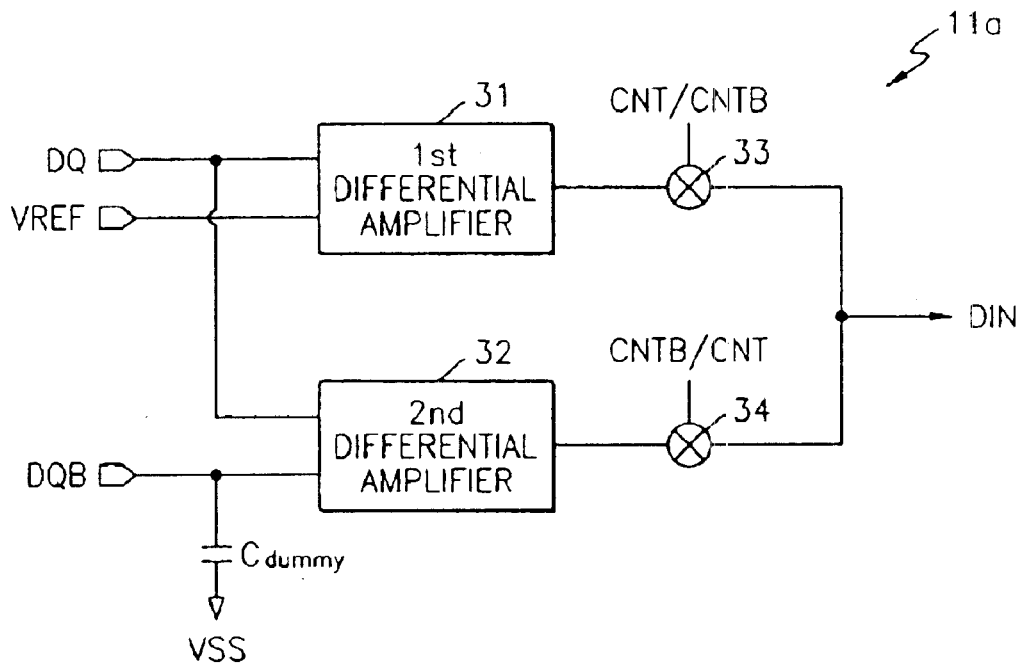
FIG. 19 is a block diagram of a data input buffer according to another exemplary embodiment of the present invention.

FIG. 19 is a block diagram of a data input buffer 11a according to another exemplary embodiment of the present invention. The data input buffer 11a of FIG. 19 may include all of the elements of the exemplary embodiment of FIG. 14. The data input buffer 11a of FIG. 19 may also include a dummy load capacitor Cdummy, such as the one described in conjunction with FIG. 16. In particular, in a line through which the inverse signal (DQB) is input, the dummy load capacitor Cdummy is added so as to have the same load as the load of a line in which the data strobe signal (DQ) is input. The second differential amplifier 32 then differentially amplifies the data signal (DQ) and its inverse signal (DQB). Accordingly, the setup/hold time in the SM mode is substantially the same as the setup/hold time in the DM mode, and as a result, the data setup/hold margin improves.

Figure 20:
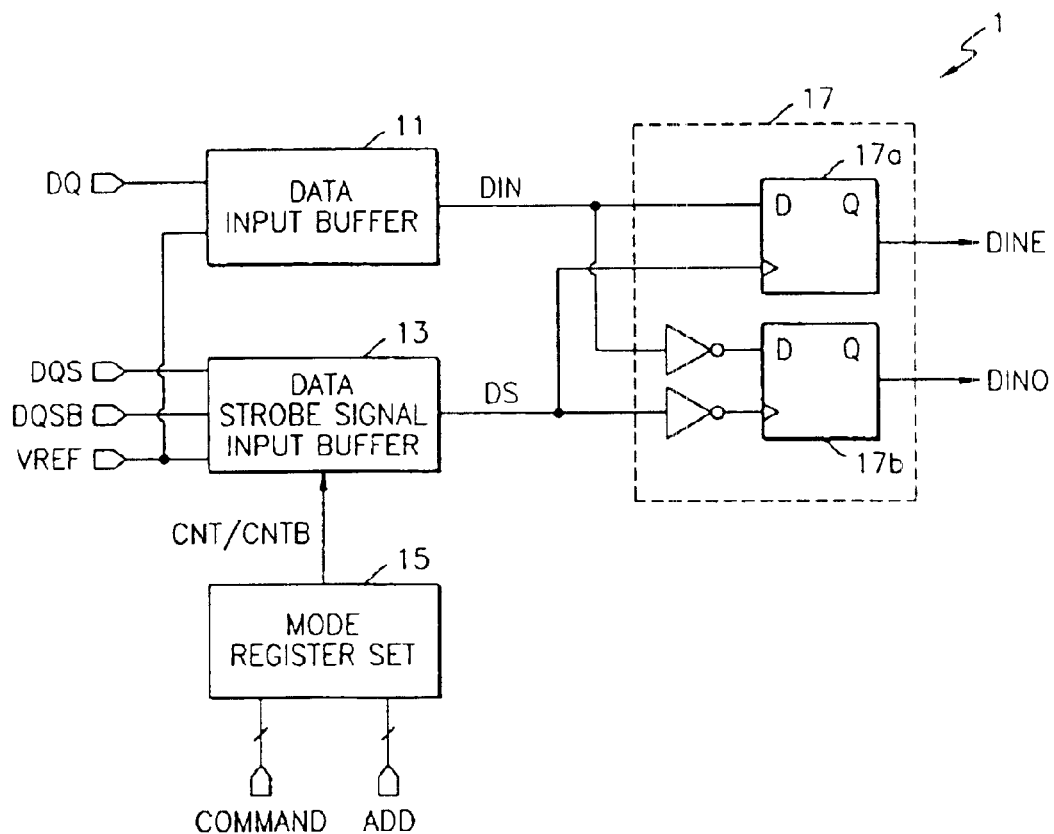
FIG. 20 is a block diagram of a semiconductor memory device according to an exemplary embodiment of the present invention.

FIG. 20 is a block diagram of a semiconductor memory device 1 according to another exemplary embodiment of the present invention. The semiconductor memory device 1 may include a data input buffer 11, 11a, a data strobe input buffer 13, 13a, a control circuit, such as mode register set (MRS) 15, and a data write circuit 17.

The data input buffer 11, 11a receives and buffers data (DQ). The data strobe input buffer 13, 13a may be a multimode buffer, such as single mode/dual mode (SM/DM) double-use data buffer. In response to the control signal (CNT/CNTB) output from the mode register set 15, the data strobe input buffer 13 differentially amplifies a data strobe signal (DQS) and a reference voltage (VREF), or the data strobe signal (DQS) and its inverse signal (DQSB). The mode register set 15 receives an external address signal (ADD) and/or an external command signal, and generates the control signal (CNT/CNTB).

That is, in the semiconductor memory device 1 according to exemplary embodiments of the present invention, one of the two modes, the SM and DM modes, of the data input data strobe input buffer 13, 13a is externally selected through the mode register set 15 so that the data strobe input buffer 13, 13a operates. If the data strobe signal (DQS) and the reference voltage (VREF) are differentially amplified, the data strobe input buffer 13 outputs the differentially amplified signal without delay in the SM mode and, if the data strobe signal (DQS) and its inverse signal (DQSB) are differentially amplified, outputs the differentially amplified signal after a desired time delay in the DM mode.

More specifically, in order to maintain a substantially constant setup/hold time both in the SM mode and DM mode, the propagation delay time from the input terminal to the output terminal of the data strobe input buffer 13 should be substantially constant both in the SM mode and DM mode. However, the gain of a differential amplifier included in the data strobe input buffer 13 in the SM mode is different from the gain in the DM mode. That is, the gain in the SM mode, in which the differential amplifier differentially amplifies the data strobe signal (DQS) and the reference voltage (VREF), is less than the gain in the DM mode, in which the differential amplifier differentially amplifies the data strobe signal (DQS) and its inverse signal (DQSB). Accordingly, the propagation delay time of the data strobe input buffer 13 in the DM mode is shorter than that in the SM mode.

Therefore, in the various exemplary embodiments of the present invention as described above, the differentially amplified signal may be delayed for a desired time in the DM mode such that the propagation delay time of the data strobe input buffer 13 in the DM mode is substantially the same as the propagation delay time in the SM mode. Accordingly, the setup/hold time in the SM mode becomes the substantially the same as the setup/hold time in the DM mode, and the setup/hold margin of data improves.

As described above, the data strobe input buffer 13 is controlled by the mode register set 15. The mode register set 15 can be set by an external address signal (ADD) of the semiconductor memory device 1, and generates a control signal (CNT/CNTB) controlling the data strobe input buffer 13. If the output signal of the mode register set 15 is at a first logic state, the data strobe input buffer 13 differentially amplifies the data strobe signal (DQS) and reference voltage (VREF), and outputs the differentially amplified signal without delay. If the output signal of the mode register set 15 is at a second logic state, the data strobe signal input buffer 13 differentially amplifies the data strobe signal (DQS) and its inverse signal (DQSB), and outputs the differentially amplified signal after a predetermined time delay.

Figure 21:
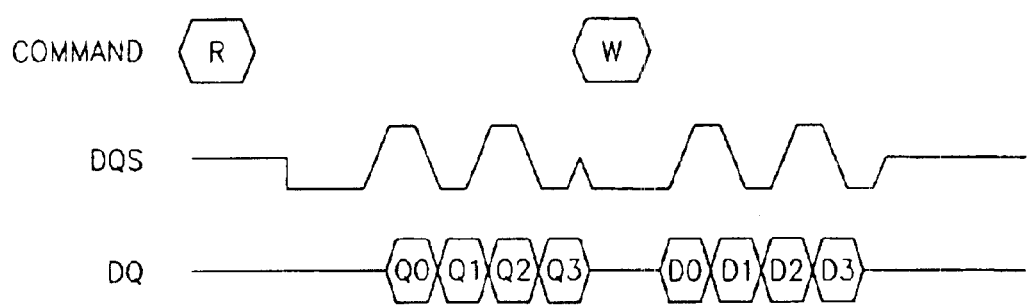
FIG. 21 illustrates the output of the data strobe signal (DQS) and the data signal (DQ) during DDR operation according to a semiconductor memory device according to an exemplary embodiment of the present invention.

As illustrated in FIG. 20, the data write circuit 17, in response to the output signal of the data strobe input buffer 13, latches the output signal (DIN) of the data input buffer 11. The data write circuit 17 may include a first latch 17a and a second latch 17b. The first latch 17a, in response to the rising edge of the output signal (DS) of the data strobe input buffer 13, latches even number data of the output signal (DIN) of the data input buffer 11, and the second latch 17b, in response to the falling edge of the output signal of the data strobe input buffer 13, latches odd number data of the output signal (DIN) of the data input buffer 11. As a result, the semiconductor memory device 1 operates as a DDR synchronous DRAM. FIG. 21 illustrates the output of the data strobe signal (DQS) and the data signal (DQ) during the DDR operation of the semiconductor memory device 1.

Figure 22:
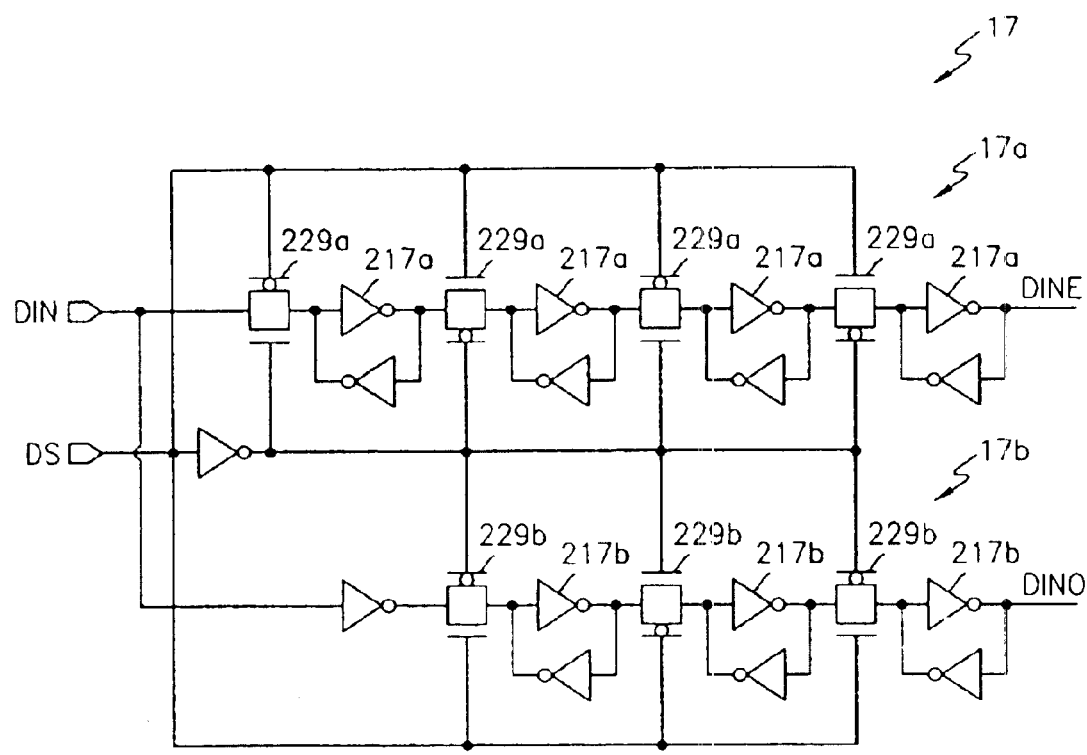
FIG. 22 is a block diagram of the latch circuit according to an exemplary embodiment of the present invention.

FIG. 22 is a block diagram of the data write circuit 17 according to an exemplary embodiment of the present invention. The latch circuit may include a first latch 17a, for latching even number data of the output signal (DIN) of the data input buffer 11 in response to the rising edge of the output signal (DS) of the data strobe input buffer 13 and a second latch 17b, for latching odd number data of the output signal (DIN) of the data input buffer 11 in response to the falling edge of the output signal (DS) of the data strobe input buffer 13.

The first latch 17a may include a plurality of latches 217a and a plurality of switches 229a, arranged alternatively. Additionally, the plurality of switches 229a of the first latch 17a are arranged to be triggered on the leading and falling edge (DDR operation) of an inverse of the differential output signal (DS). The first switch 229a receives the even number data of the output signal (DIN) of the data input buffer 11 and passes the even number data of the output signal (DIN) to the first of the plurality of latches 217a.

The second latch 17b may include a plurality of latches 217b and a plurality of switches 229b, arranged alternatively. Additionally, the plurality of switches 229b of the second latch 17b are arranged to be triggered on the leading and falling edge (DDR operation) of an inverse of the differential output signal (DS). The first switch 229b receives the odd number data of the output signal (DIN) of the data input buffer 11 and passes the odd number data of the output signal (DIN) to the first of the plurality of latches 217b.

Figure 23:
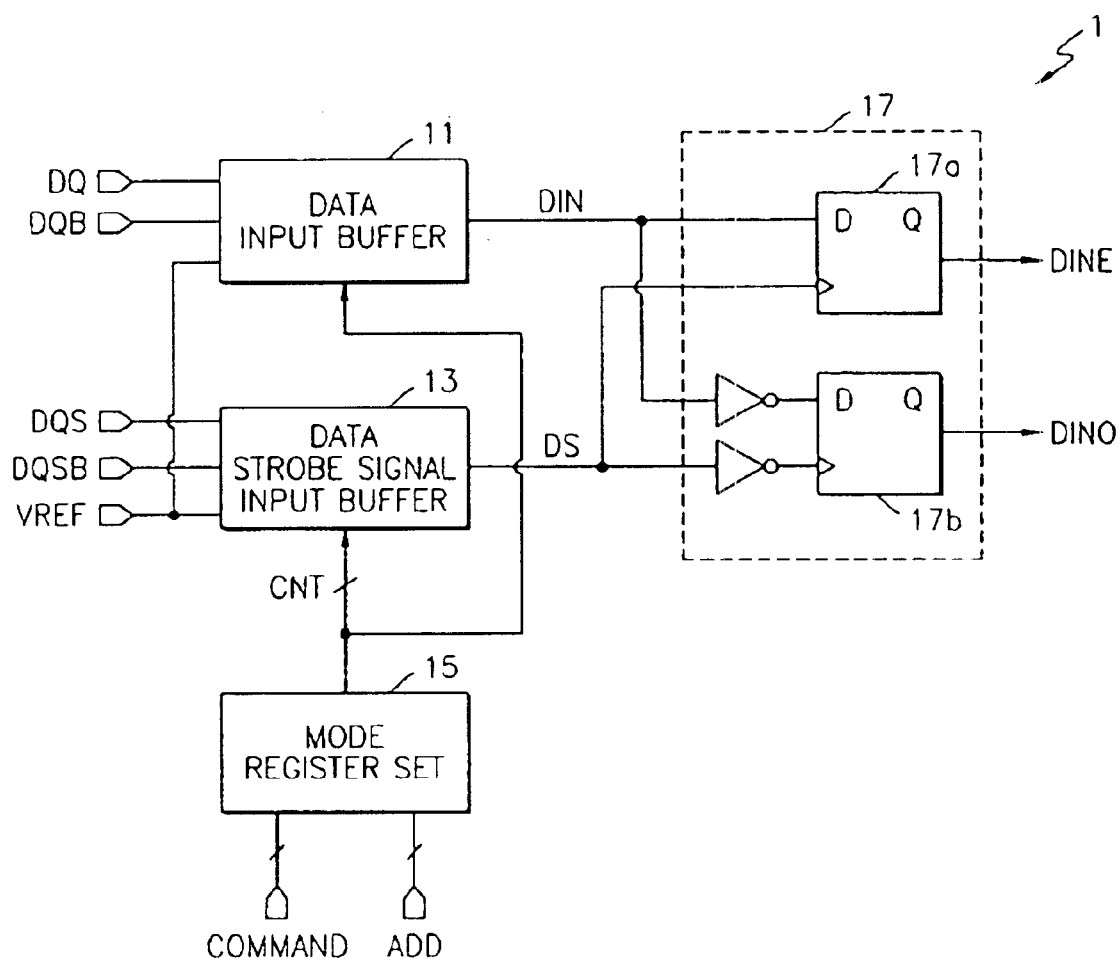
FIG. 23 is a block diagram of a semiconductor memory device according to another exemplary embodiment of the present invention.

FIG. 23 is a block diagram of a semiconductor memory device 1 according to another exemplary embodiment of the present invention. The semiconductor memory device 1 may include a data input buffer 11, 11a, a data strobe input buffer 13, 13a, a control circuit, such as mode register set (MRS) 15, and a data write circuit 17. In the exemplary embodiment illustrated in FIG. 23, both the data input buffer 11, 11a and a data strobe input buffer 13, 13a are multimode buffers, such as single mode/dual mode (SM/DM) double-use data buffers and both are controlled by the control signal (CNT/CNTB).

Although the invention has been described with reference to exemplary embodiments, it will be apparent to one of ordinary skill in the art that modifications of the described embodiments may be made without departing from the spirit and scope of the invention.

What is claimed is:

1. A data strobe input buffer, comprising:
   a differential amplifier circuit including at least two switches for passing an inverse data strobe signal or a reference voltage, respectively, depending on a level of a control signal, and a differential amplifier for receiving a data strobe signal and either the inverse data strobe signal or the reference voltage and outputting a differentially amplified signal.

2. The data strobe input buffer of claim 1, wherein the differentially amplified signal is transmitted into output terminals as at least two data strobe signals through two transmission path in response to the control signal.

3. The data strobe input buffer of claim 1, wherein the data strobe input buffer is operable in both a single mode and a dual mode, wherein in said single mode, the reference voltage is applied to a first of the at least two switches and the level of the control signal is a first logic state and in said dual mode, the inverse data strobe signal is provided to a second of the at least two switches and the level of the control signal is a second logic state.

4. A semiconductor memory device comprising:
   a data strobe input buffer including;
   a differential amplifier circuit including at least two switches for passing an inverse data strobe signal or a reference voltage, respectively, depending on a level of a control signal, and a differential amplifier for receiving a data strobe signal and either the inverse data strobe signal or the reference voltage and outputting a differentially amplified signal;
   wherein the differentially amplified signal is transmitted into output terminals as at least two data strobe signals through two transmission paths in response to the control signals.

5. The semiconductor memory device of claim 4, further comprising a control circuit for outputting the control signal to said data strobe input buffer.

6. The semiconductor memory device of claim 5, said control circuit including,
   a mode register set for receiving an external command and an address and generating the control signal, wherein a level of the control signal determines a mode of the semiconductor memory device.

7. The semiconductor memory device of claim 5, said control circuit including, a fuse circuit including a fuse, wherein a state of the fuse determines a level of the control signal.

8. The semiconductor memory device of claim 5, said control circuit including, a bonding pad circuit, wherein a connection to Vcc or ground determines a level of the control signal.

9. The semiconductor memory device of claim 4, wherein the differential amplifier includes a single differential amplifier.

10. The semiconductor memory device of claim 9, wherein the semiconductor memory device further includes a compensating circuit for compensating one of the inverse data strobe signal, the reference voltage, or the data strobe signal or the differentially amplified signal so that each of at least two data strobe signals have substantially the same delay time.

11. The semiconductor memory device of claim 10, wherein said compensating circuit includes a delay circuit for receiving the differentially amplified signal from said differential amplifier circuit, said delay circuit including a delay for delaying the differentially amplified signal, at least two additional switches for passing the differentially amplified signal or the delayed differentially amplified signal, as one of the at least two data strobe signals, depending on the level of the control signal.

12. The semiconductor memory device of claim 10, wherein said compensating circuit includes a dummy load applied to one of the inverse data strobe signal, the reference voltage or the data strobe signal.

13. The semiconductor memory device of claim 4, wherein the differential amplifier includes at least two differential amplifiers.

14. The semiconductor memory device of claim 13, wherein a gain of a first of the at least two differential amplifiers is substantially different from a gain of a second of the at least two differential amplifiers so that each of at least two data strobe signals have substantially the same delay time.

15. The semiconductor memory device of claim 13, wherein a gain of a first of the at least two differential amplifiers is substantially the same as a gain of a second of the at least two differential amplifiers.

16. The semiconductor memory device of claim 15, wherein the semiconductor memory device further includes a compensating circuit for compensating one of the inverse data strobe signal, the reference voltage, or the data strobe signal or one of at least two different differentially amplified signals so that each of at least two data strobe signals have substantially the same delay time.

17. The semiconductor memory device of claim 16, wherein said compensating circuit includes a delay circuit for receiving the differentially amplified signal from said differential amplifier circuit, said delay circuit including a delay for delaying the differentially amplified signal, at least two additional switches for passing the differentially amplified signal or the delayed differentially amplified signal, as one of the at least two data strobe signals, depending on the level of the control signal.

18. The semiconductor memory device of claim 16, wherein said compensating circuit includes a dummy load applied to one of the inverse data strobe signal, the reference voltage, or the data strobe signal.

19. A semiconductor memory device comprising:
a data input buffer including at least two switches for passing an inverse data signal or a reference voltage, respectively, depending on a level of a control signal, and a differential amplifier for receiving a data signal and either the inverse data signal or the reference voltage and outputting a differentially amplified data input signal in response to the control signal;
a data strobe input buffer including at least two switches for passing an inverse data strobe signal or a reference voltage, respectively, depending on a level of the control signal, and a differential amplifier for receiving a data strobe signal and either the inverse data strobe signal or the reference voltage and outputting a differentially amplified data strobe signal in response to the control signal;
a control circuit for outputting the control signal to said data input buffer 11 and said data strobe input buffer; and
a data write circuit for receiving the data input signal from said data input buffer and the writing even number data of the data input signal into a first latch in response to a rising edge of the data strobe signal and writing odd number data of the data input signal into a second latch in response to a falling edge of the data strobe signal.

20. The semiconductor memory device of claim 19, said first latch including a plurality of latches and a plurality of switches, arranged alternatively.

21. The semiconductor memory device of claim 20, wherein said plurality of switches are arranged to be triggered on the leading and falling edge of an inverse of the data strobe signal.

22. The semiconductor memory device of claim 21, wherein a first switch receives the even number data of the output signal of the data input buffer and passes the even number data of the output signal to a first of the plurality of latches.

23. The semiconductor memory device of claim 19, said second latch including a plurality of latches and a plurality of switches, arranged alternatively.

24. The semiconductor memory device of claim 23, wherein said plurality of switches are arranged to be triggered on the leading and falling edge of an inverse of the data strobe signal.

25. The semiconductor memory device of claim 24, wherein a first switch receives the odd number data of the output signal of the data input buffer and passes the odd number data of the output signal to a first of the plurality of latches.

26. A method of controlling propagation delay time of a semiconductor memory, comprising:
receiving an inverse data strobe signal or a reference voltage, respectively, depending on a level of a control signal;
receiving a data strobe signal; and
amplifying and outputting at least two different differentially amplified data strobe signals.

27. The method of claim 26, wherein in a single mode, the reference voltage is received and a level of the control signal is a first logic state and in a dual mode, the inverse data strobe signal is received and the level of the control signal is a second logic state.

28. The method of claim 27, wherein the control signal is received from an external source.

29. The method of claim 27, further comprising:
receiving an external command and an address and generating the control signal, wherein a level of the control signal determines an operation mode of the semiconductor memory.

* * * * *